(12) United States Patent
Lee

(10) Patent No.: US 6,521,960 B2
(45) Date of Patent: Feb. 18, 2003

(54) COLUMN TRANSISTOR FOR SEMICONDUCTOR DEVICES

(75) Inventor: Kyoung Soo Lee, Kyoungki-do (KR)

(73) Assignee: Hyundai Electronics Industries Co., Ltd. (KR)

(*) Notice: Subject to any disclaimer, the term of this patent is extended or adjusted under 35 U.S.C. 154(b) by 0 days.

(21) Appl. No.: 09/750,017

(22) Filed: Dec. 29, 2000

(65) Prior Publication Data

US 2001/0022378 A1 Sep. 20, 2001

(30) Foreign Application Priority Data

Dec. 30, 1999 (KR) ............................................. 99-66307

(51) Int. Cl.⁷ .................... H01L 29/76; H01L 29/94; H01L 31/062
(52) U.S. Cl. ........................................ 257/401; 257/369
(58) Field of Search .................. 257/401, 369

(56) References Cited

U.S. PATENT DOCUMENTS

| | | | |
|---|---|---|---|
| 5,389,810 A | * | 2/1995 | Agata et al. |
| 5,416,350 A | | 5/1995 | Watanabe |
| 5,444,275 A | * | 8/1995 | Kugishima et al. |
| 5,689,129 A | * | 11/1997 | Pearce |
| 5,859,805 A | | 1/1999 | Takashima et al. |

FOREIGN PATENT DOCUMENTS

| | | |
|---|---|---|
| EP | 0 840 325 A2 | 5/1998 |
| JP | 60167360 A | 8/1995 |

* cited by examiner

Primary Examiner—Stephen D. Meier
(74) Attorney, Agent, or Firm—Pillsbury Winthrop LLP

(57) ABSTRACT

A column transistor of a sense amplifier includes an orthogonal matrix of a plurality of sets of four active regions, bit lines and local data lines running perpendicular to each other, with each active region having two bit lines and one local data line connected thereto. Further, the gate electrode is provided with a bent portion, the bent portion positioned over the active region, thereby increasing the effective width of the transistor, which in turn reduces a number of contacts of the column transistor and increases channel width, thereby permitting the column transistors to be arranged in a smaller area and increasing the area available within a cell for forming the sense amplifier. The reduced size of the column transistors also allows increases in design and manufacturing tolerances, particularly in formation of contacts, which is favorable for high density device packing and enhancing the operational performance of the resulting device.

9 Claims, 10 Drawing Sheets

COLUMN TRANSISTOR FOR SEMICONDUCTOR DEVICES

BACKGROUND OF THE INVENTION

1. Field of the Invention

The present invention relates to an improved column transistor configuration for use in semiconductor devices and, more particularly, to a column transistor in a semiconductor memory device, which transmits data on a bit line to a local data line or vice versa, having an improved and more efficient layout that allows increased device packing density.

2. Background of the Related Art

In semiconductor memory devices, the layout area of the sense amplifier usually depends on the size of a memory cell. For this reason, as the packing density of the memory device increases, the size of each memory cell is also decreased. This reduction in memory cell size requires that the size of the sense amplifier, which senses and amplifies the data from the memory cell, must be reduced in proportion to the size reduction of the memory cell. This reduction in the size of the sense amplifier lowers the driving performance of the sense amplifier as well. It is very important, however, to increase or at least maintain the operating frequency of the memory device to correspond to the increased operating frequencies obtained by advanced microprocessors.

The present invention provides a method for enhancing the driving performance of the sense amplifier as one of method for increasing the operating frequency of the memory device. The present invention also provides a method for providing a more efficient and effective layout for column transistors that are located between the bit lines and the local data lines to maximize the area of the sense amplifiers located between the bit lines.

FIG. 1 illustrates a circuit diagram of for conventional prior art column transistors, showing an example of the column transistors each with a width of 2.28 μm. A plurality of paired bit lines Biti, BitBi, Bitj, and BitBj are arranged in one direction, and a plurality of local data (bus) lines LDBi, LDBBi, LDBj, and LDBBj that are arranged in a generally perpendicular relation to the bit lines and connected to the column transistors (CT1~CT8). As shown, the data on the bit line Biti is transferred to the local data line LDBj through nodes N1 and N2 by the column transistors CT1 and CT5, the data on the bit line Bitj is transferred to local data line LDBBj through nodes N3 and N4 by the column transistors CT2 and CT6. Similarly the data on the bit line BitBi is transferred to the local data line LDBBi through nodes N5 and N6 by the column transistors CT3 and CT7, and the data on the bit line BitBj is transferred to local data line LDBj through nodes N7 and N8 by the column transistors CT4 and CT8. That is, there are data transmission paths of Biti→CT1→LDBi, Bitj→CT2→LDBBj, BitBi→CT3→LDBBi, and BitBj→CT4→LDBj.

The physical layout of such column transistors will be discussed with reference to FIGS. 2 and 3. Rectangular shaped active regions 10 are arranged on a semiconductor substrate in a regular check pattern with groups of four adjacent active regions 10 constituting one set of active regions. Each active region 10 is crossed twice by a gate electrode 12, to produce an effective gate width of approximately twice the width of the active region (1.14 μm) for a total width of 2.28 μm. A single gate electrode 12 structure overlaps a set of active regions 10 to form a set of four column transistors, for example CT1~CT4. Bit lines 14, Biti, Bitj, BitBi, and BitBj, are arranged sequentially in one direction across a set of active regions, with each bit line contacting a separate one of the adjacent active regions 10 via a pair of contacts BC. Local data lines 16, LDBi, LDBBj, LDBBi, LDBj, are arranged in a direction perpendicular to the bit lines 14 and overlapping two of the adjacent active regions 10. Each of the local data lines 16 is in contact with a separate one of the set of active regions 10, and consequently a separate one of the column transistors CT1~CT4, via a local data line contact LDBC. The gate electrodes 12 for the column transistors CT1~CT4 are connected by metal lines via metal contacts MC. This basic structure is then repeated for each set of active regions across the semiconductor device.

Because the prior art methods for forming the column transistor can not effectively reduce the area of the column transistors connected to the sense amplifiers, the prior art methods are generally unsuitable for improving the efficiency of the sense amplifier layout within a given area. In light of these deficiencies, previous attempts to produce devices having both extremely high packing densities and enhanced operating performance have failed.

SUMMARY OF THE INVENTION

Accordingly, the present invention is directed toward a column transistor arrangement in a semiconductor device that substantially reduces or eliminates one or more of the limitations and disadvantages of the prior art arrangements.

The claimed inventions provide column transistors for semiconductor devices that include a sense amplifier connected to a local data line and a bit line having shared active regions. More specifically, each of the active areas constitutes either a source or a drain region for a pair of adjacent column transistors that are separate sets of column transistors.

The configuration of the gate electrode structures is modified to remain more substantially within the column transistor, thereby increasing the effective width of the resulting transistor. With the gate electrodes bent to form a ¤ character form, all the gate electrodes of corresponding column transistors are connected to a single sense amplifier, the gate electrode for each set of column transistors contacts metal wiring at only one point, and each active region is in contact with two bit lines and one local data line. In another aspect of the present invention, a semiconductor device can be fabricated in which the column transistors are arranged in an orthogonal matrix comprising a plurality of sets of four square active regions, a gate electrode having a bent portion overlapped with the set and being connected to a sense amplifier along with a plurality of other column transistors. Further the column transistors according to the present invention are arranged with four bit lines running over each one of the active regions, with only two the bit lines making contact with any single active region, and four local data lines running in a direction perpendicular to the bit lines, with only two of the data lines running over any single active region, only one of which will be in contact with a specific active region.

It is to be understood that both the foregoing general description and the following detailed description are exemplary and explanatory and are intended to provide further explanation of the invention as claimed.

BRIEF DESCRIPTION OF THE DRAWINGS

The accompanying figures are included to provide a further understanding of the present invention and illustrate specific embodiments of the invention and supplement the description of the invention.

DETAILED DESCRIPTION OF THE PREFERRED EMBODIMENT

A detailed description of the present invention with appropriate references to the related Figures is provided below.

Figure 1:
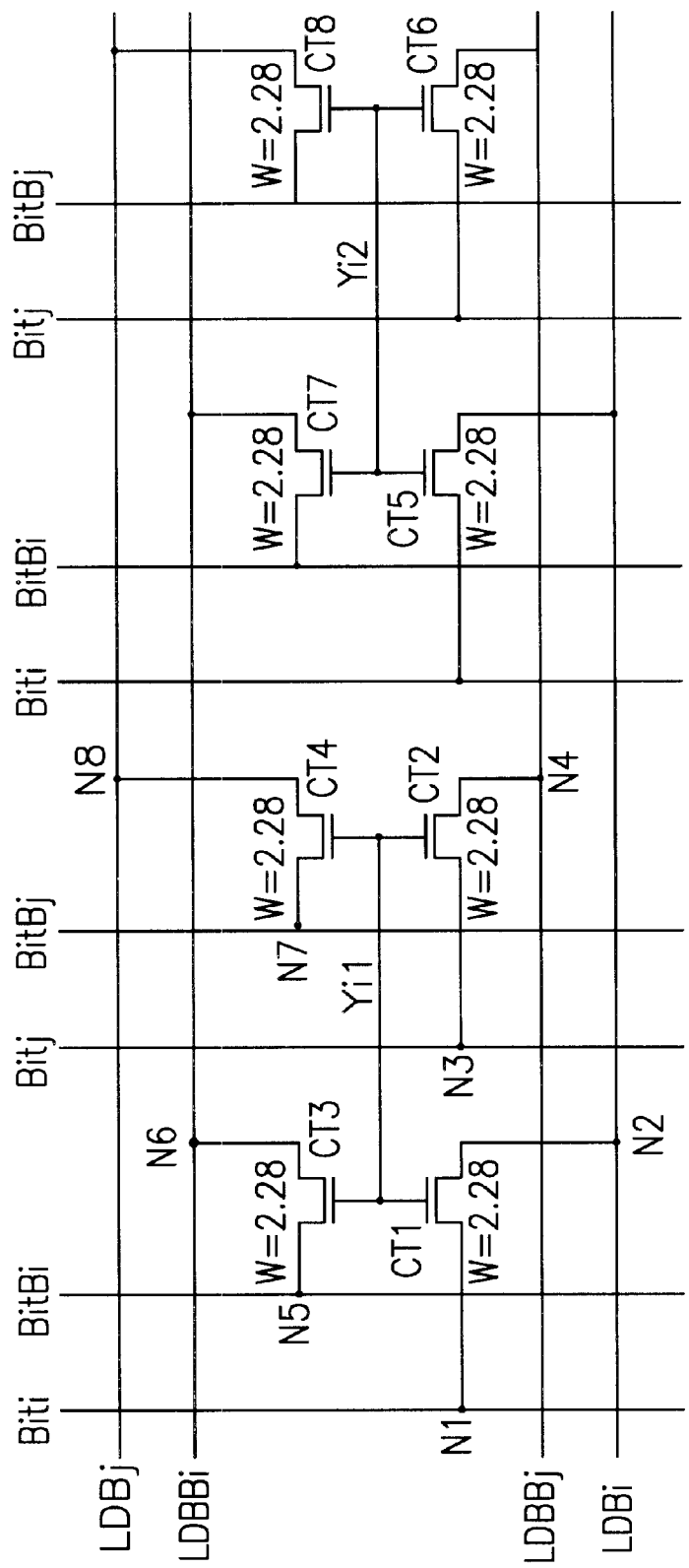
FIG. 1 is a circuit diagram illustrating related art sense amplifier column transistors.
Figure 2:
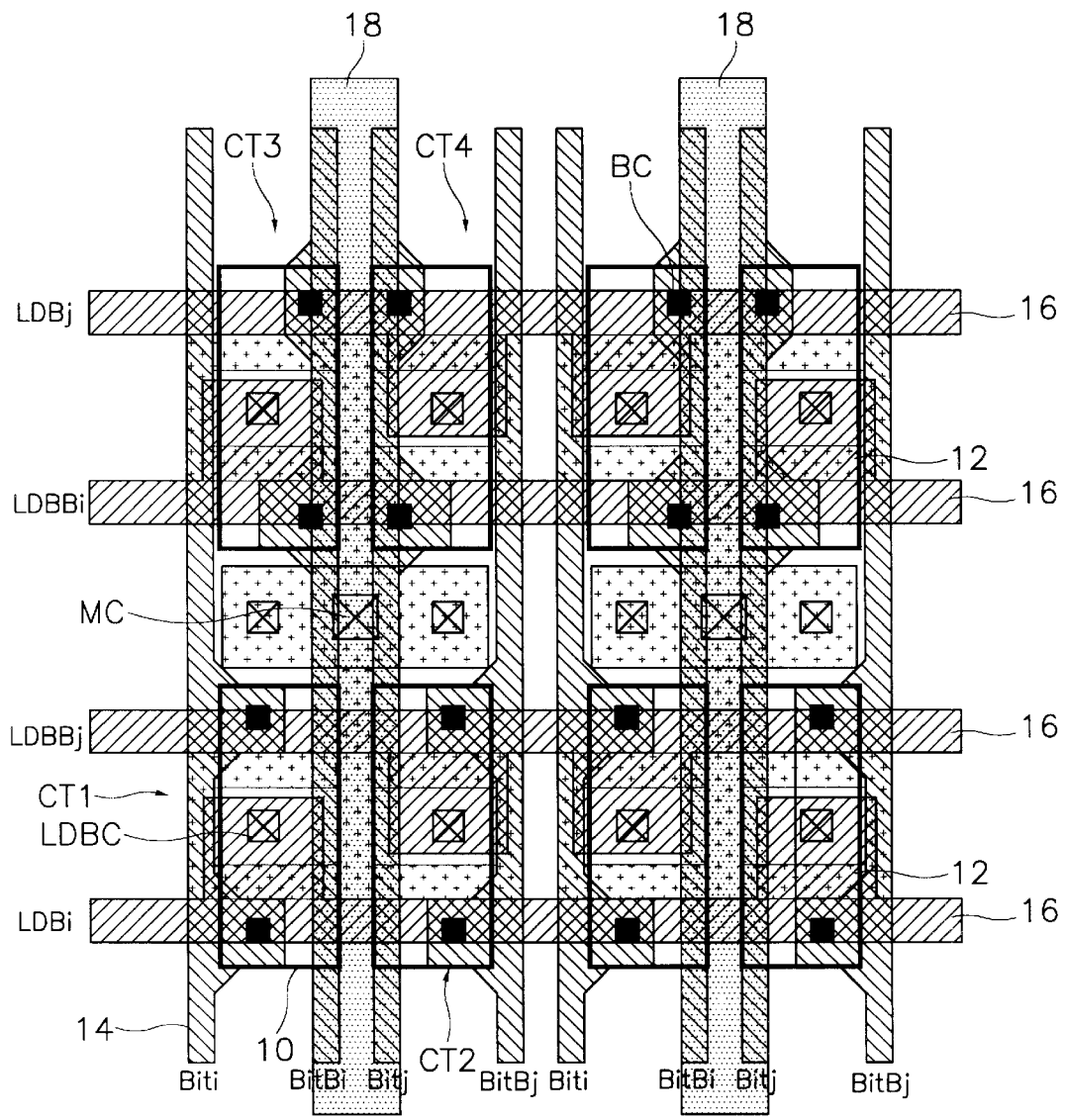
FIG. 2 is a layout illustrating the circuit in FIG. 1.
Figure 3A:
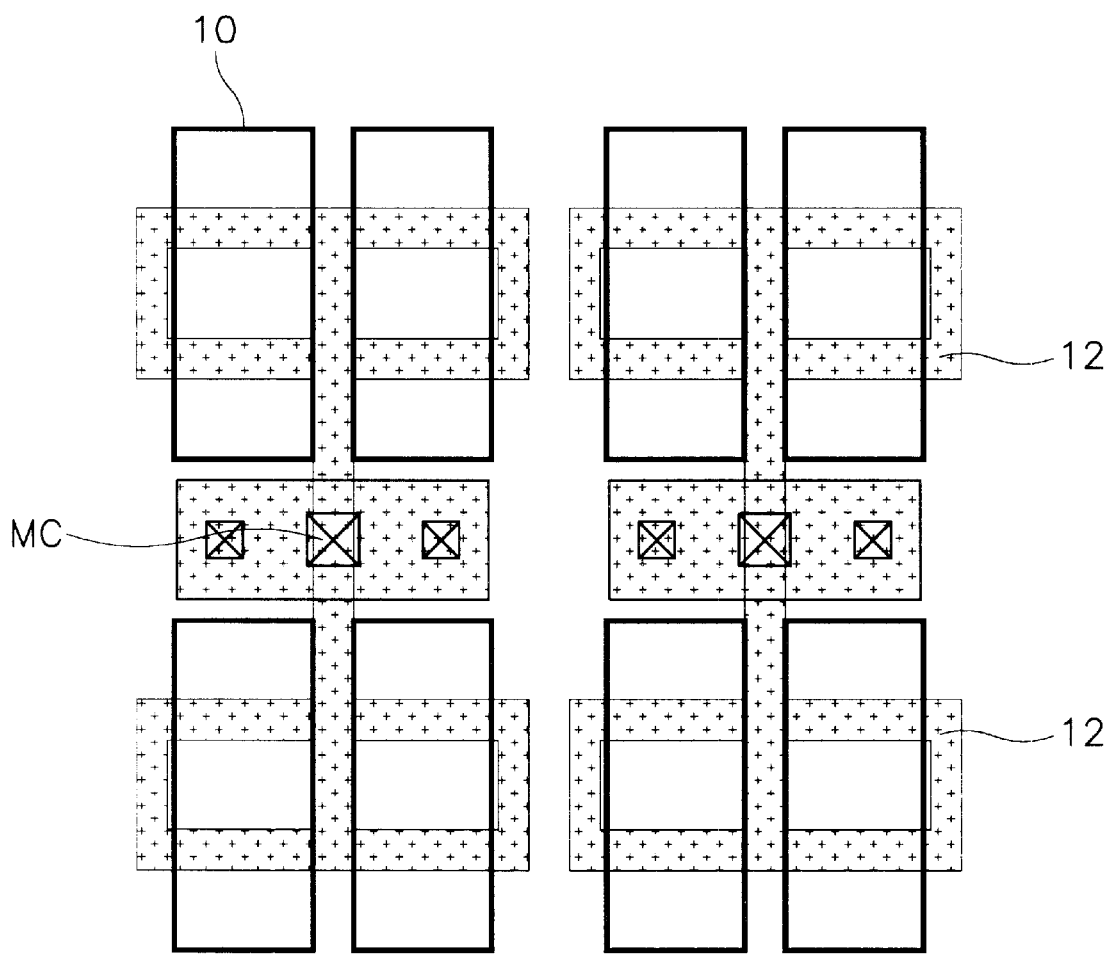
FIG. 3A is a layout illustrating the active regions and the gate electrodes in FIG. 2.
Figure 3B:
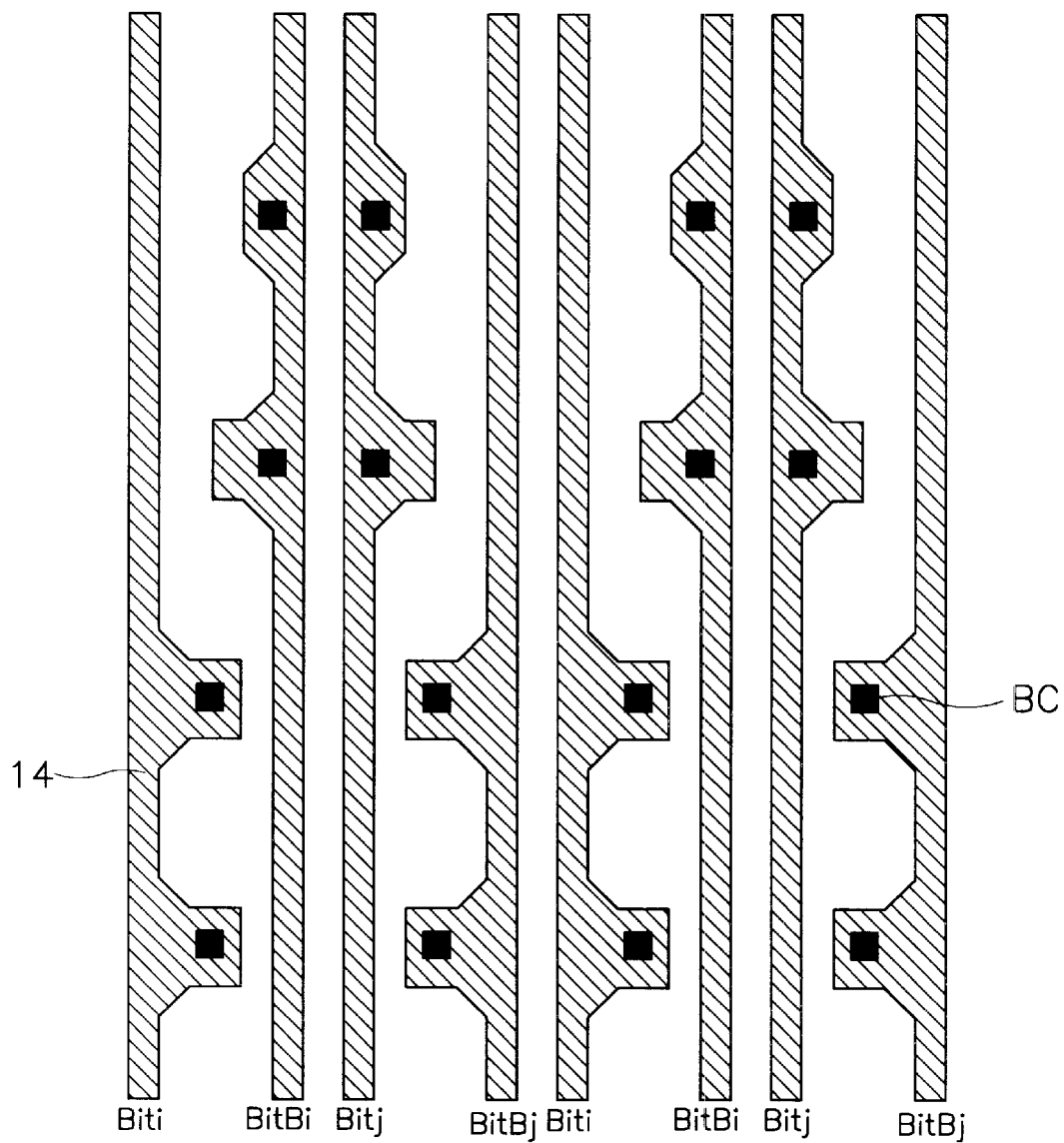
FIG. 3B is a bit line layout in FIG. 2.
Figure 3C:
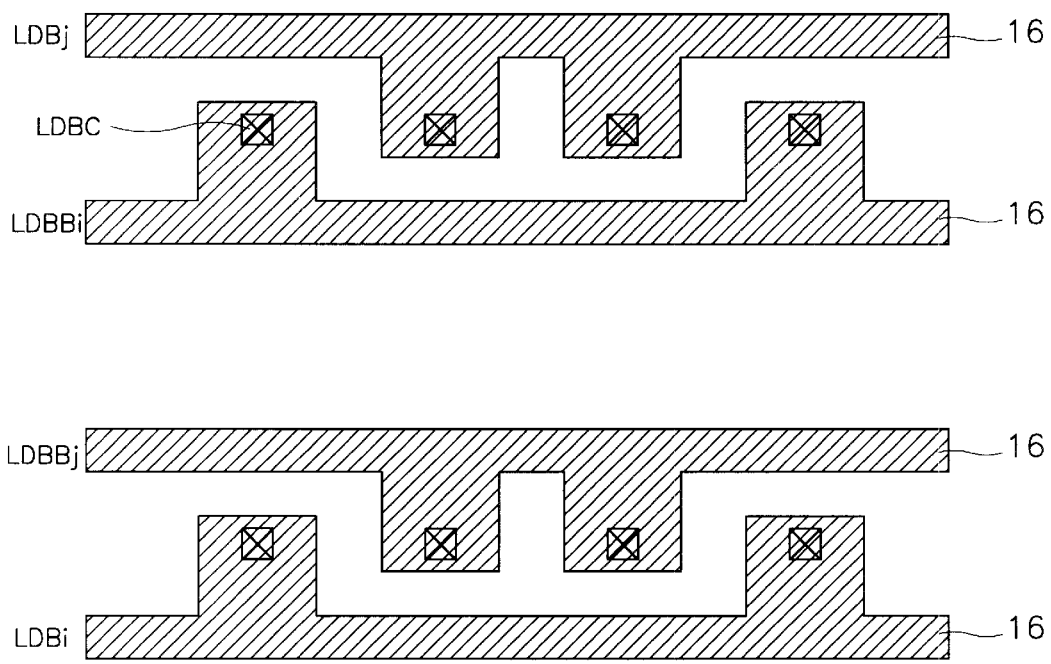
FIG. 3C is a local data busline layout in FIG. 2.
Figure 4:
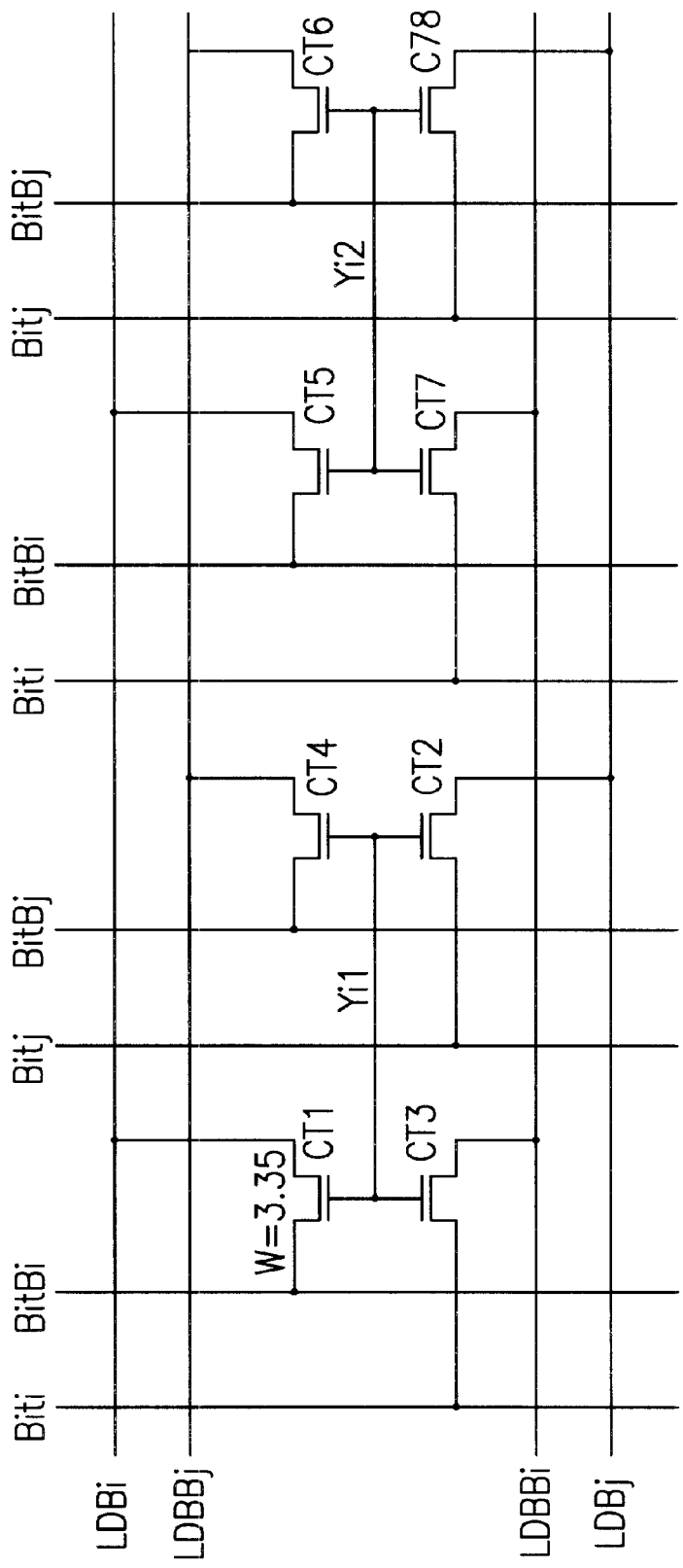
FIG. 4 is a circuit diagram illustrating a sense amplifier column transistor in accordance with a preferred embodiment of the present invention.

The circuit diagram corresponding to an arrangement of column transistors according to the present invention provided in FIG. 4 and is similar in many respects to the circuit diagram relating to the prior art provided in FIG. 1. The circuit diagram provided in FIG. 4 does, however, reflect a rearrangement in the a layout of local data lines to an order of LDBi, LDBBj, LDBBi, LDBj, a layout that is a characteristic of the present invention.

Figure 5:
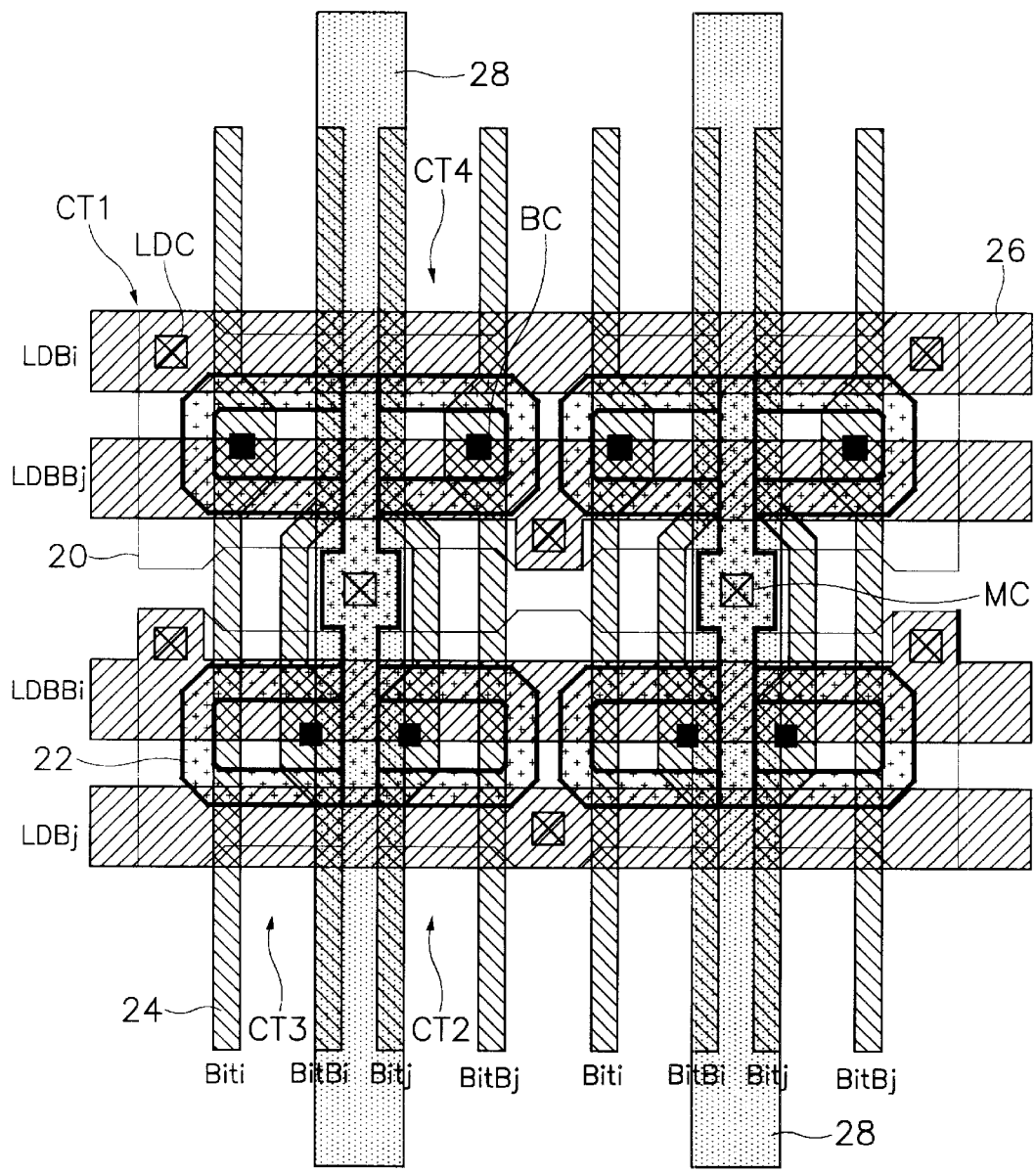
FIG. 5 is a layout illustrating the circuit in FIG. 4.
Figure 6A:
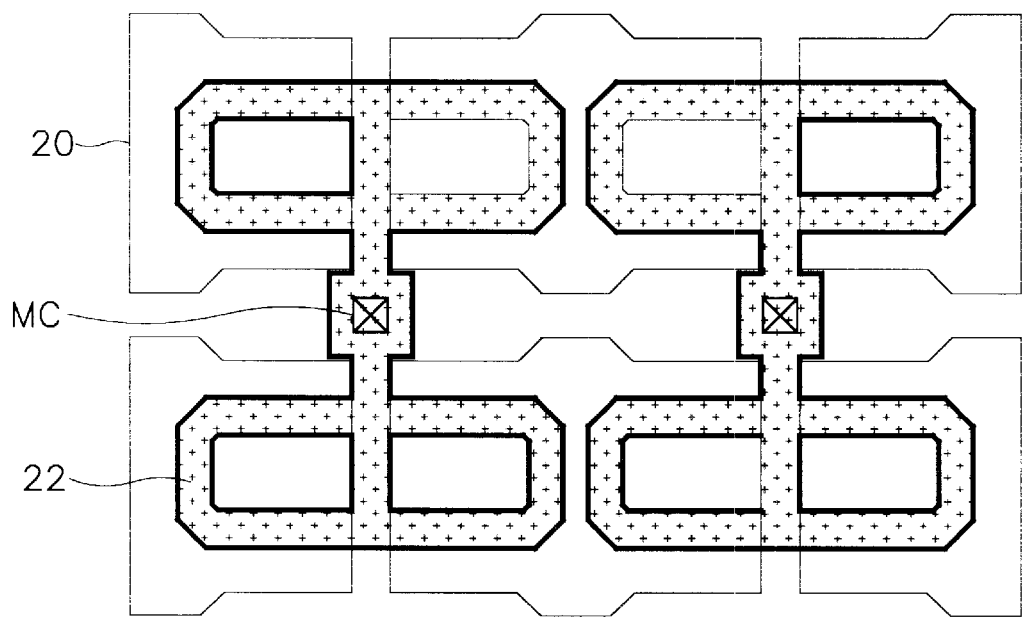
FIG. 6A is a layout illustrating the active regions and the gate electrodes in FIG. 5.
Figure 6B:
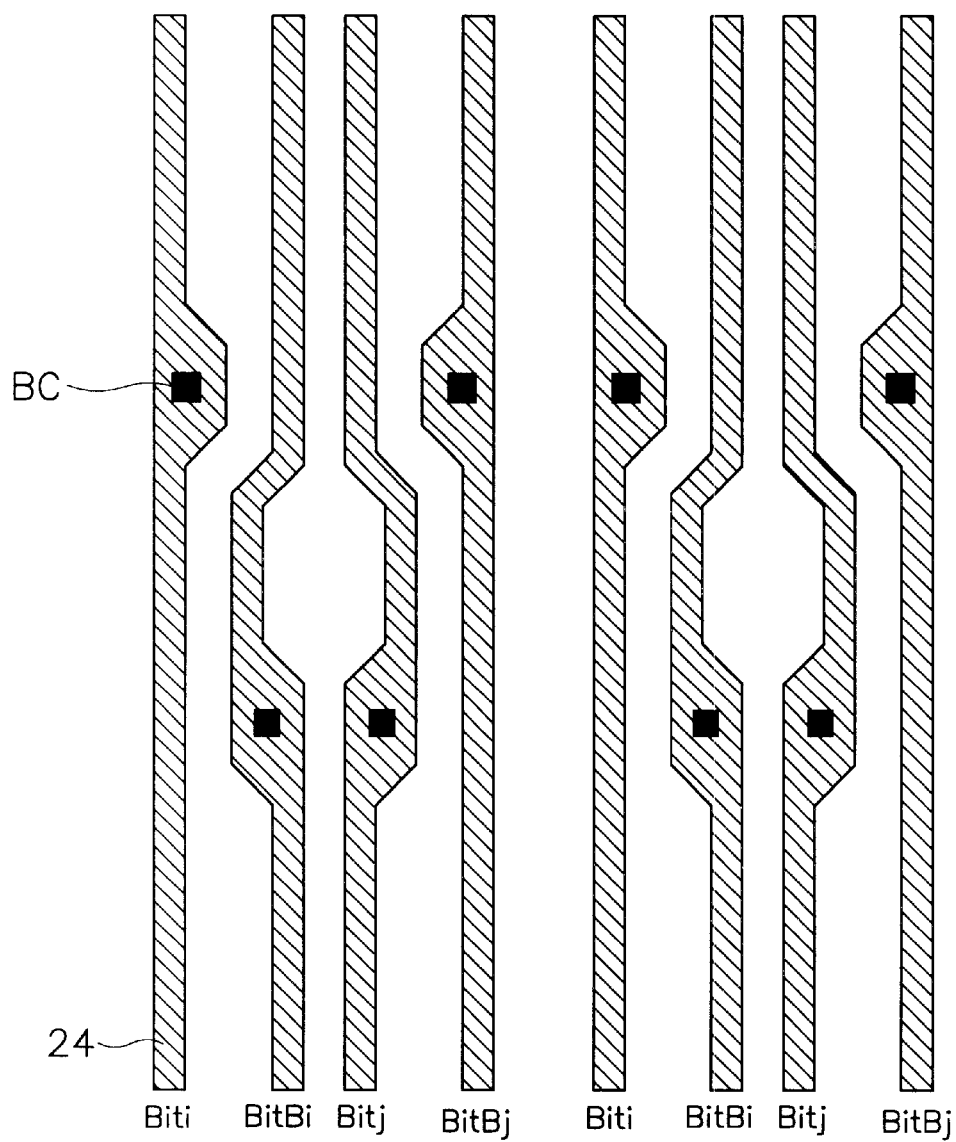
FIG. 6B is a bit line layout in FIG. 5.
Figure 6C:
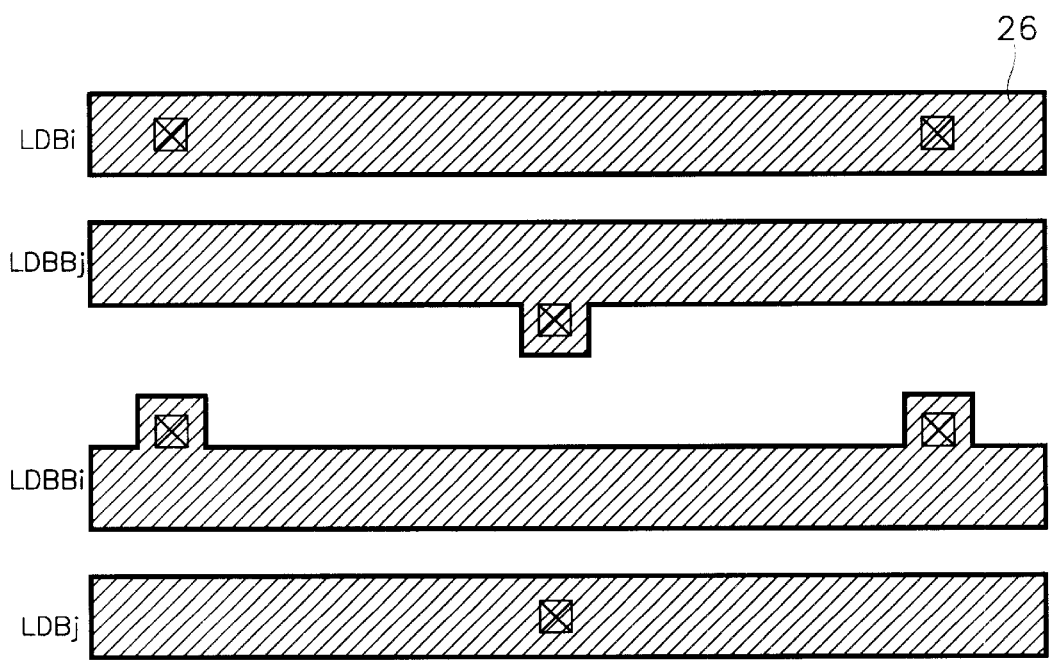
FIG. 6C is a layout illustrating the local data busline in FIG. 5.

FIG. 5 illustrates a possible layout of the circuit in FIG. 4. FIG. 6A illustrates the layout of the active regions and the gate electrodes corresponding to FIG. 5. Similarly, FIG. 6B illustrates the bit line layout, and FIG. 6C illustrates the layout of the local data lines, as illustrated in FIG. 5.

Four adjacent column transistors constitute one set to share active regions 20, and the active regions 20 of adjacent two sets of column transistors CT1~CT4 and CT5~CT8 are formed to share source/drain regions with adjacent sense amplifier column transistors. Each gate electrode 22, having a shape such as an "∩", "U", or "⊏", is arranged over portions of four adjacent active regions 20, to provide the gate electrode for four separate column transistors such as CT1~CT4. Bit lines 24, Bitj, BitBj, BitBi, and Biti, are arranged in one direction above the active regions 20 overlapping therewith, and local data lines 26 are arranged in the sequential order LDBi, LDBBj, LDBBi, and LDBj and in a direction perpendicular to the bit lines 24. A metal wire 28 is formed over a portion of the device between adjacent active regions 20 in a direction parallel to the bit lines 24.

The bit lines 24 are each connected to one active region 20 through two bit line contacts BC, and the local data line 26 is connected to one active region 20 through one local data line contact LDC, with gate electrode for each set of four column transistors being connected to the metal wiring 28 through a metal wiring contact MC. The basic structure of the present invention is four adjacent active regions that are repeatedly arranged in a check pattern, with each active region connected to two bit lines from adjacent sets of column transistors and one local data line, the data line contact being made inside the "∩" shape of gate electrode 22. Thus, two column transistors share either one source or drain region.

According to the foregoing layout, a gate electrode the would provide a width of 1.14 $\mu$m (crossing twice to reach 2.28 $\mu$m) in the prior art configuration can produce an effective gate width of approximately 3.35 $\mu$m. Without changing the basic design rules, therefore, the present invention can increase the width of the column transistors by approximately 47%, while simultaneously reducing the necessary cell area by eliminating contacts used in the prior art configuration.

As described above, the sense amplifier column transistors according to the present invention provide the same basic orthogonal matrix of sets of active regions, bit lines and local data lines running perpendicular to each other, but with each active region being connected to two bit lines and one local data line, and a gate electrode having a bent portion that increases the effective width of the transistor. By increasing the effective width of the transistor, while simultaneously reducing the number of contacts required, the present invention allows the sets of column transistors to be fabricated in a smaller area, thereby increasing the area available for the sense amplifier. Further, by forming the transistors according to the present invention, improvements in design tolerance as well as a fabrication tolerances relating to the formation of the contacts can be realized, results that are favorable for high density device packing and enhancing a device operation performance and lifetime.

It will be apparent to those skilled in the art that various modifications and variations can be made to the method of forming column transistors according to the present invention without departing from the spirit or scope of the invention. Thus, it is intended that the present invention not be limited to the specific disclosure provided but instead cover any insubstantial modifications and variations to the method defined by the following claims.

What is claimed is:

1. A first column transistor connected to a local data line and a first bit line, comprising a first gate electrode, a first source region, and a first drain region, the first source region and second drain region being formed in an active region;

a second column transistor connected to a local data line and a second bit line, comprising a second gate electrode, a second source region, and a second drain region, the second source region and second drain region being formed in the active region, wherein the first column transistor and the second column transistor are positioned adjacent one another and sharing only one of a common source region or a common drain region; and a plurality of column transistors connected to a common sense amplifier wherein each column transistor includes a gate electrode, each of the gate electrodes being connected to one another and to a metal wiring through a single contact.

2. The first and second column transistors as claimed in claim 1, wherein at least one of the first gate electrode and the second gate electrode is configured with one or more bends over the active region, thereby increasing the width of at least one of the gate transistors.

3. The column transistor as claimed in claim 2, wherein at least one of the gate electrodes is bent to form an approximate "⊏" shape.

4. The column transistor as claimed in claim 1, wherein the active region is in contact with two bit lines and one local data line.

5. A semiconductor device comprising:

an orthogonal matrix of gate electrodes, each gate electrode comprising four bent portions to form closed loops, each of the four bent portions being formed on one of four separate active regions and defining four separate column transistors, the four column transistors comprising a set of transistors, wherein the gate electrodes are electrically inter-connected to one another;

a plurality of parallel bit lines, four bit lines running over each set of transistors, only two of the four bit lines being in contact with any single active region;

a plurality of parallel local data lines, the local data lines running in a direction substantially perpendicular to the bit lines, four local data lines running over each set of transistors, only two local data lines running over any single active region, and only one local data line being in contact with any single active region.

6. The column transistor as claimed in claim 5, wherein the gate electrode is configured in a "⊏" shape.

7. The semiconductor device as claimed in claim 5, wherein the inter-connected gate electrodes are connected to a metal wiring through a single contact.

8. The semiconductor device as claimed in claim 5, wherein the bit lines are in contact with the active regions inside the closed loops.

9. A column transistor in a semiconductor device comprising:

an orthogonal matrix of a plurality of sets of four square active regions;

gate electrodes having a ∩ or U formed bent portion overlapped with the active region, adjacent four of which constitute one set in a form connected with one another and are connected to one sense amplifier;

bit lines running in one direction such that a first bit line, a first complementary bit line, a second bit line and a second complementary bit line adjacent to one another are sequentially overlapped with one of the active regions, two of the four bit lines being in contact with the one active region; and local data lines running in a direction perpendicular to the bit lines such that two of the local data lines are running over one active region, only one of which is in contact with the active region, with one set of four local data lines arranged in an order of adjacent first local data line, second complementary local data line, first complementary local data line, and second data line starting from a right side of one set of four active regions.

\* \* \* \* \*